(12) United States Patent
Guyot et al.

(10) Patent No.: US 10,177,785 B2
(45) Date of Patent: Jan. 8, 2019

(54) ERROR DETECTING CODE WITH PARTIAL UPDATE

(71) Applicant: HGST Netherlands B.V., Amsterdam (NL)

(72) Inventors: Cyril Guyot, San Jose, CA (US); Lluis Pamies-Juarez, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/245,079

(22) Filed: Aug. 23, 2016

(65) Prior Publication Data

US 2018/0062665 A1    Mar. 1, 2018

(51) Int. Cl.
| H03M 13/00 | (2006.01) |
| H03M 13/09 | (2006.01) |
| H03M 13/29 | (2006.01) |
| G06F 11/10 | (2006.01) |

(52) U.S. Cl.
CPC ....... H03M 13/093 (2013.01); G06F 11/1004 (2013.01); H03M 13/00 (2013.01); H03M 13/2906 (2013.01)

(58) Field of Classification Search
None
See application file for complete search history.

(56) References Cited

U.S. PATENT DOCUMENTS

| 5,844,918 | A | * | 12/1998 | Kato | ..................... | H03M 13/03 |
| | | | | | | 714/751 |
| 6,601,216 | B1 | | 7/2003 | Obata | | |
| 7,227,797 | B2 | * | 6/2007 | Thayer | ................ | G06F 11/1044 |
| | | | | | | 365/200 |
| 2008/0028133 | A1 | * | 1/2008 | Kwon | ................. | G06F 11/1032 |
| | | | | | | 711/103 |
| 2009/0271568 | A1 | * | 10/2009 | Kwon | ................. | G06F 11/1032 |
| | | | | | | 711/103 |
| 2013/0080862 | A1 | * | 3/2013 | Bennett | ............... | G06F 11/1076 |
| | | | | | | 714/782 |
| 2013/0145229 | A1 | * | 6/2013 | Frayer | .............. | H03M 13/2903 |
| | | | | | | 714/755 |
| 2013/0179759 | A1 | | 7/2013 | Aronovich et al. | | |
| 2014/0201428 | A1 | | 7/2014 | Kirazci et al. | | |
| 2016/0217030 | A1 | * | 7/2016 | Shin | ..................... | G06F 11/085 |

OTHER PUBLICATIONS

International Search Report and Written Opinion, PCT/US2017/034859, dated Oct. 19, 2017 (12 pages).

* cited by examiner

*Primary Examiner* — Mujtaba M Chaudry
(74) *Attorney, Agent, or Firm* — Patent Law Works LLP (57) ABSTRACT

An approach for generating updated error detecting code for a partial update of data is disclosed. The techniques include receiving data representing a change to a portion of a data object, the data object having a first error detecting code, and the portion of the data object having an offset from the beginning of the data object; generating a combination term by combining the data and the portion of the data object; and computing a second error detecting code based on the combination term. The techniques may further include computing a third error detecting code by combining the first error detecting code and the second error detecting code, the third error detecting code being configured to detect an error in the data object as changed by the data, and storing the data and the third error detecting code.

20 Claims, 5 Drawing Sheets

ERROR DETECTING CODE WITH PARTIAL UPDATE

BACKGROUND

The present disclosure relates to error detecting code. In particular, the present disclosure relates to generating an updated error detecting code for a partial update of data. More specifically, the present disclosure relates to generating an updated error detecting code for a modified data object when an unmodified version of the data object has an existing error detecting code.

Existing object stores often store error detecting codes to validate that data is correct before returning the data to a user or application. However, an error detecting code is no longer valid if the data, for which the error detecting code was generated, is modified. Some existing solutions resolve this problem by simply not allowing data to be modified, so that the error detecting code remains valid. Other solutions require that the entire data object be read, modified, and then a new error detecting code be calculated based on the updated data.

The requirement to read back the entire piece of data and recalculate the error detecting code requires substantial computing and storage device time. Similarly, existing methods do not allow data to be updated while also maintaining the ability to check the integrity of that data.

SUMMARY

Systems and methods for generating an updated error detecting code for a partial update of a data object are disclosed. The systems and methods introduced herein allow a data object to be updated in place and an updated error detecting code to be quickly generated for the updated data object without having to read back the entire data object. For example, in some implementations, a system includes one or more processors and a memory storing instructions that cause the one or more processors to receive data representing a change to a portion of a data object, the data object having a first error detecting code, and the portion of the data object having an offset from a beginning of the data object. The instructions may further cause the one or more processors to generate a combination term by combining the data and the portion of the data object, compute a second error detecting code based on the combination term, and compute a third error detecting code by combining the first error detecting code and the second error detecting code. The third error detecting code may be configured to detect an error in the data object as changed by the data. Additionally, the instructions may cause the one or more processors to store the data and the third error detecting code.

Other implementations of one or more of these aspects include corresponding systems, apparatus, methods, and computer programs, configured to perform the actions of the methods, encoded on computer storage devices. It should be understood that the language used in the present disclosure has been principally selected for readability and instructional purposes, and not to limit the scope of the subject matter disclosed herein.

BRIEF DESCRIPTION OF THE DRAWINGS

The techniques described herein are illustrated by way of example, and not by way of limitation, in the figures of the accompanying drawings in which like reference numerals are used to refer to similar elements.

DETAILED DESCRIPTION

Systems and methods for generating an updated error detecting code for a partial update of a data object are described below. While the systems and methods of the present disclosure are described in the context of a particular system architecture, it should be understood that the systems and methods can be applied to other architectures and organizations of hardware.

Existing technology does not allow a data object to be updated in place while maintaining a valid error detecting code ("EDC"). For example, existing distributed data stores, such as Ceph, allow data objects to be updated, but do not enable the EDC to be updated contemporaneously with the data object by marking the data object as updated and then later reading back the data object and computing a new EDC for the updated data object. In the time period between when the data object is updated and the new EDC is computed, no valid EDC exists for the updated data object. Additionally, the process of reading back the data object and computing a new EDC requires substantial computing time and resources. The techniques described herein resolve these issues by allowing a data object to be updated in place and also generating a new EDC for the updated data object without accessing the non-modified portions of the updated data object.

An EDC is a code that is generated, based on data to be used later, to verify the integrity of the data. For example, an EDC may be generated for a data object, transmitted and/or stored with the data object, and then used to verify the integrity of the data object prior to returning the data object to a user or application. One type of an EDC is a cyclic redundancy check, although there are numerous other types of EDCs. For example, although the techniques described herein are described in terms of a cyclic redundancy check ("CRC"), the techniques are also applicable to other types of CRC-like mechanisms, such as Rabin fingerprints, etc.

A CRC includes a check value attached to a data object. The CRC for a data object may be calculated using Equation 1:

$$\mathrm{CRC}(M)(X) = (M(X) * X^n) \bmod G(X), \quad (1)$$

where $G(X)$ is a polynomial of degree n over $GF(2)$ (e.g., the coefficients of which are defined in the Galois Field $GF(2)$) and $M(X)$ is a polynomial of degree m over $GF(2)$ that represents the data on which the CRC is computed. It should be noted that the polynomial $G(X)$ may be irreducible, but other implementations are possible. Additionally, in practice, the polynomials of Equation 1 may be truncated in order to allow computation by a computing device.

Figure 2:
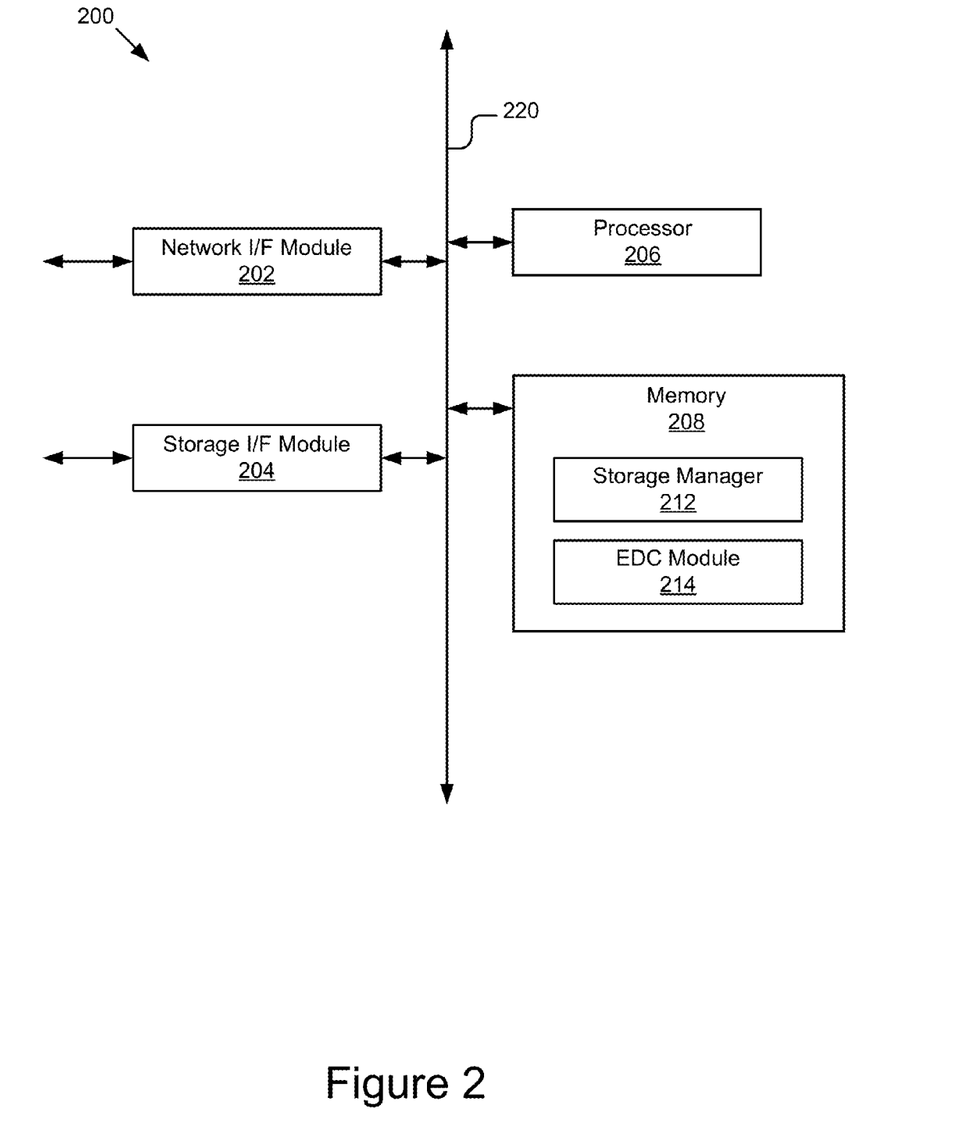
FIG. 2 is a block diagram illustrating an example computing device for implementing the techniques introduced herein.

The techniques described herein include methods for generating an updated EDC for a partial update of a data object. The techniques may include calculating a combination term based on the new data and the portion of the data object that is being updated. The combination term is a mechanism that is used according to the techniques described herein to enable a system to update an EDC for a data object. In some implementations, the combination term includes a first part and a second part, the first part having logical zeros written up to an offset corresponding to the position of the portion of the data object within the data object, and the second part being a combination of the new data and the portion of the data object that is being updated. In such implementations, an EDC module 214 (as shown in FIG. 2) may compute an EDC of the combination term and combine the EDC of the combination term with the previous EDC of the data object to generate a new EDC that can be used to validate the updated data object. Some implementations include that the combination term has the second part (e.g., a combination of the new data and the portion of the data object that is being updated), but no zeros written up to the offset. In such implementations, the EDC module 214 may compute an update term based on a correction EDC of the combination term and one or more additional elements, such as a modification factor. Further, in some implementations, a system may dynamically select between the methods described herein. For example, the first implementation described above may be better suited for computing an EDC for changes near the beginning of the data object (e.g., that have a small offset), while the latter implementation may be better suited for computing an EDC for changes that are toward the end of the data object. The threshold at which the system determines which method to use may be calculated based on an estimated time to compute the new EDC and may depend on processing speed, types of storage media, etc. For example, an EDC module 214 may calculate a threshold offset indicating which method to use based on a defined (e.g., administrator-entered, pre-calculated, dynamically-calculated, etc.) rate at which each method updates the EDC combined with the processing power of a system and a rate of accessing storage media of the system.

These and other implementations of the techniques described herein provide many benefits. For example, the techniques allow update in place of a data object while determining a new EDC for the updated data object without reading unmodified portions of the data object. The techniques described herein may compute a new EDC three to six orders of magnitude more quickly than existing techniques. Thus, a computing system configured to use the techniques described herein uses significantly less power and computing time and resources to generate an updated EDC. Additionally, these techniques enable the computing system to dynamically maintain an EDC for a data object, so the data object can be read and verified without waiting for a new EDC to be calculated at a later time.

Figure 1:
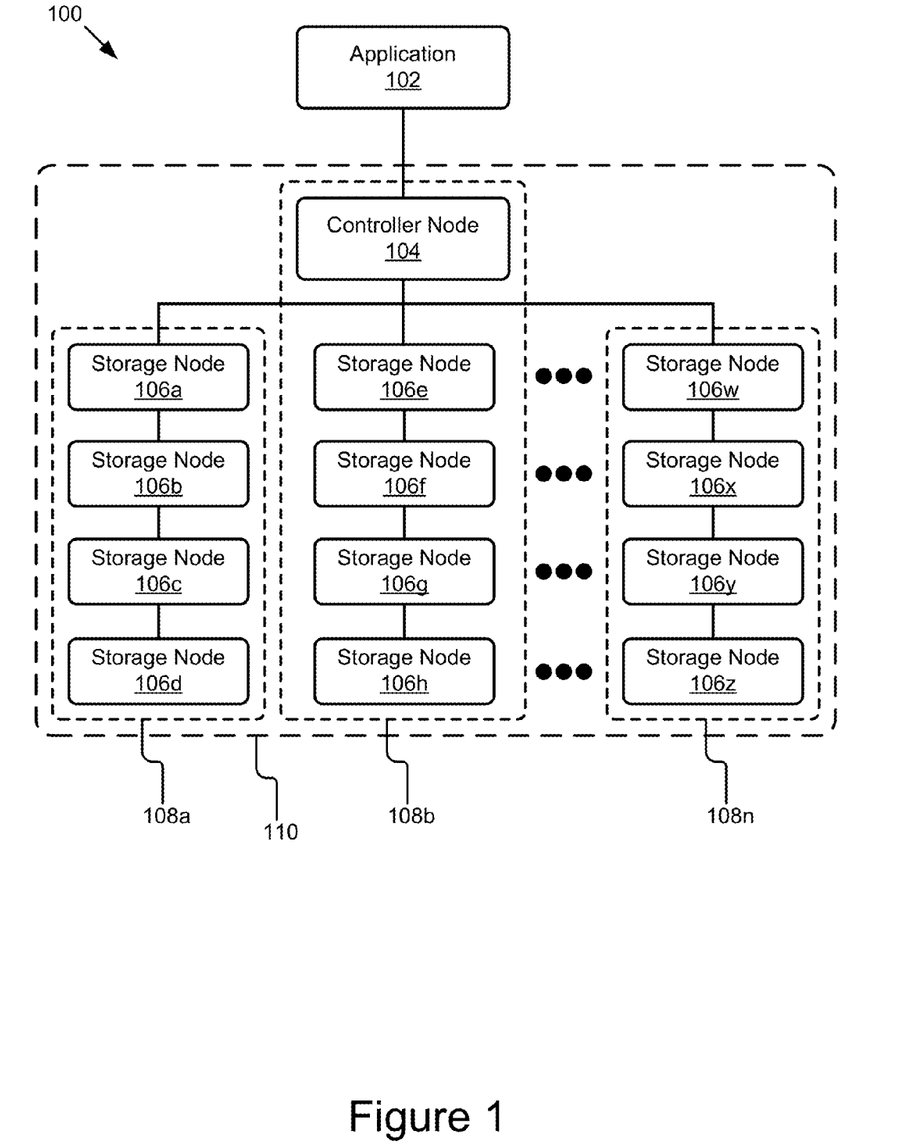
FIG. 1 is a high-level block diagram illustrating an example object storage system.

FIG. 1 is a high-level block diagram illustrating an example system 100. The system 100 may include a distributed object storage system 110 that is connected to an application 102 for transferring data objects according to one implementation. The connection between the application 102 and the object storage system 110 may be implemented as a suitable data communication network. The application 102 could, for example, be a software application running on a computing device, such as a personal computer, a laptop, a smartphone, a personal digital assistant, or any other type of communication device that is able to interface with the distributed object storage system 110. The application 102 could alternatively comprise a suitable file system which enables a general purpose software application to interface with the object storage system 110 or an Application Programming Interface (API) library. As further shown in FIG. 1, the object storage system 110 may comprise a controller node 104 and a plurality of storage nodes 106a-106z that may be interconnected in a suitable way for transferring data, for example by means of a conventional data communication network such as a local area network (LAN), a wide area network (WAN), a telephone network (such as the Public Switched Telephone Network (PSTN)), an intranet, the Internet, and/or any other suitable network or combination of networks. A controller node 104, storage nodes 106a-106z, and the device comprising application 102 may connect to said data communication network by wired, wireless, and/or optical connections.

According to some implementations, the storage system 110 comprises any suitable number of controller nodes 104 or storage nodes 106. The controller node 104 and storage nodes 106 can be built as general purpose computers. However, they may be physically adapted for arrangement in large data centers, where they are arranged in modular racks 108a-108n comprising standard dimensions.

FIG. 2 is a block diagram illustrating an example device 200, such as a storage node 106, controller node 104, or other computing device running the application 102, for implementing the techniques introduced herein. In the example of FIG. 2, the computing device 200 includes a network interface (I/F) module 202, a storage interface (I/F) module 204, a processor 206, and a memory 208. The components of the computing device 200 are communicatively coupled to a bus or software communication mechanism 220 for communication with each other.

According to an alternative embodiment, the controller node 104 could have a similar design to storage node 106, or according to still a further alternative embodiment, one of the storage nodes 106 of the distributed object storage system 110 could perform both the function of a controller node 104 and a storage node 106. According to still further embodiments, the components of the controller node 104 as described in more detail below could be distributed amongst a plurality of controller nodes 104 and/or storage nodes 106 in any suitable way.

The network interface module 202 is configured to connect the device 200 to a network and/or other system (e.g., a controller node 104, an application 102, etc.). For example, network interface module 202 may enable communication through one or more of the Internet, cable networks, and wired networks. The network interface module 202 links the processor 206 to a network that may, in turn, be coupled to other processing systems. The network interface module 202 also provides other conventional connections to a network for distribution and/or retrieval of files and/or media objects using standard network protocols such as Transmission Control Protocol/Internet Protocol (TCP/IP), Hypertext Transfer Protocol (HTTP), Secure Hypertext Transfer Protocol (HTTPS), and Simple Mail Transfer Protocol (SMTP) as will be understood. In some implementations, the network interface module 202 includes a transceiver for sending and receiving signals using WiFi, Bluetooth®, or cellular communications for wireless communication.

The storage I/F module 204 cooperates with the storage manager 212 to read or write information to a storage device (not shown). The storage device may include any type of attached array of writable storage media, such as magnetic disk or tape, optical disk (e.g., compact disc or digital video disc), flash memory, solid-state drive (SSD), electronic random access memory (RAM), micro-electro mechanical and/or any other similar media adapted to store information. The storage I/F module 204 includes a plurality of ports having input/output (I/O) interface circuitry that couples with the storage devices over an I/O interconnect arrangement. For example, in some implementations, the storage I/F module 204 may connect a controller node 104 with a storage node 106 to access the storage node and associated storage media.

The processor 206 may include an arithmetic logic unit, a microprocessor, a general purpose controller or some other processor array to perform computations. In some implementations, the processor 206 is a hardware processor having one or more processing cores. The processor 206 is coupled to the bus 220 for communication with the other components. Processor 206 processes data signals and may include various computing architectures including a complex instruction set computer (CISC) architecture, a reduced instruction set computer (RISC) architecture, or an architecture implementing a combination of instruction sets. Although only a single processor is shown in the example of FIG. 2, multiple processors and/or processing cores may be included. It should be understood that other processor configurations are possible.

The memory 208 stores instructions and/or data that may be executed by the processor 206. In the illustrated implementation, the memory 208 includes a storage manager 212 and an error detecting code (EDC) module 214. The memory 208 is coupled to the bus 220 for communication with the other components of the device 200. The instructions and/or data stored in the memory 208 may include code for performing any and/or all of the techniques described herein. The memory 208 may be, for example, non-transitory memory such as a dynamic random access memory (DRAM) device, a static random access memory (SRAM) device, flash memory or some other memory device. The memory may further include a file system (not shown) to provide file-level data storage and retrieval.

The storage manager 212 may be configured to read and write data to a storage device. In some implementations, the storage manager 212 may include logic, code, routines, or specialized hardware for receiving data from a user or application 102 and storing the data in a storage device. In some implementations, the storage manager 212 receives a data object (e.g., from an application 102, user input, networked computing device, etc.) and corresponding EDC and stores the data object and the EDC in a storage device. In some implementations, the storage manager 212 may receive new data corresponding to a change in the data object. For example, the new data may be a change to a portion of the data object. In some instances, the storage manager 212 may store the new data to the data object without accessing the unmodified portions of the data object.

The storage manager 212 may communicate with the EDC module 214 to calculate, update, and/or verify an error detecting code. For instance, the storage manager 212 may receive new data to update a portion of a data object, retrieve the portion of the data object and an existing EDC of the data object, and then transmit the new data, the portion of the data object, and the EDC to the EDC module 214 for calculation of an updated EDC of the data object as modified by the new data.

In some implementations, the storage manager 212 may receive a read request from a user or application 102, in response to which, the storage manager 212 retrieves data from a storage device. In some instances, the storage manager 212 may retrieve a data object and verify (e.g., in conjunction with the EDC module 214) the integrity of the data object based on an EDC prior to returning the data object. In some instances, the storage manager 212 simply transmits the data object and the EDC for use and/or verification by another component of the system 100 or device 200.

In some implementations, the EDC module 214 may include logic, code, routines, or specialized hardware for generating and/or updating an EDC. In some instances, the EDC module 214 may also verify the integrity of a data object using an EDC. For example, the EDC module 214 may be configured to compute a new EDC for an updated data object, according to the techniques described herein (for example, using the relationships described in reference to Equation 2 and Equation 4 below).

Figure 3:
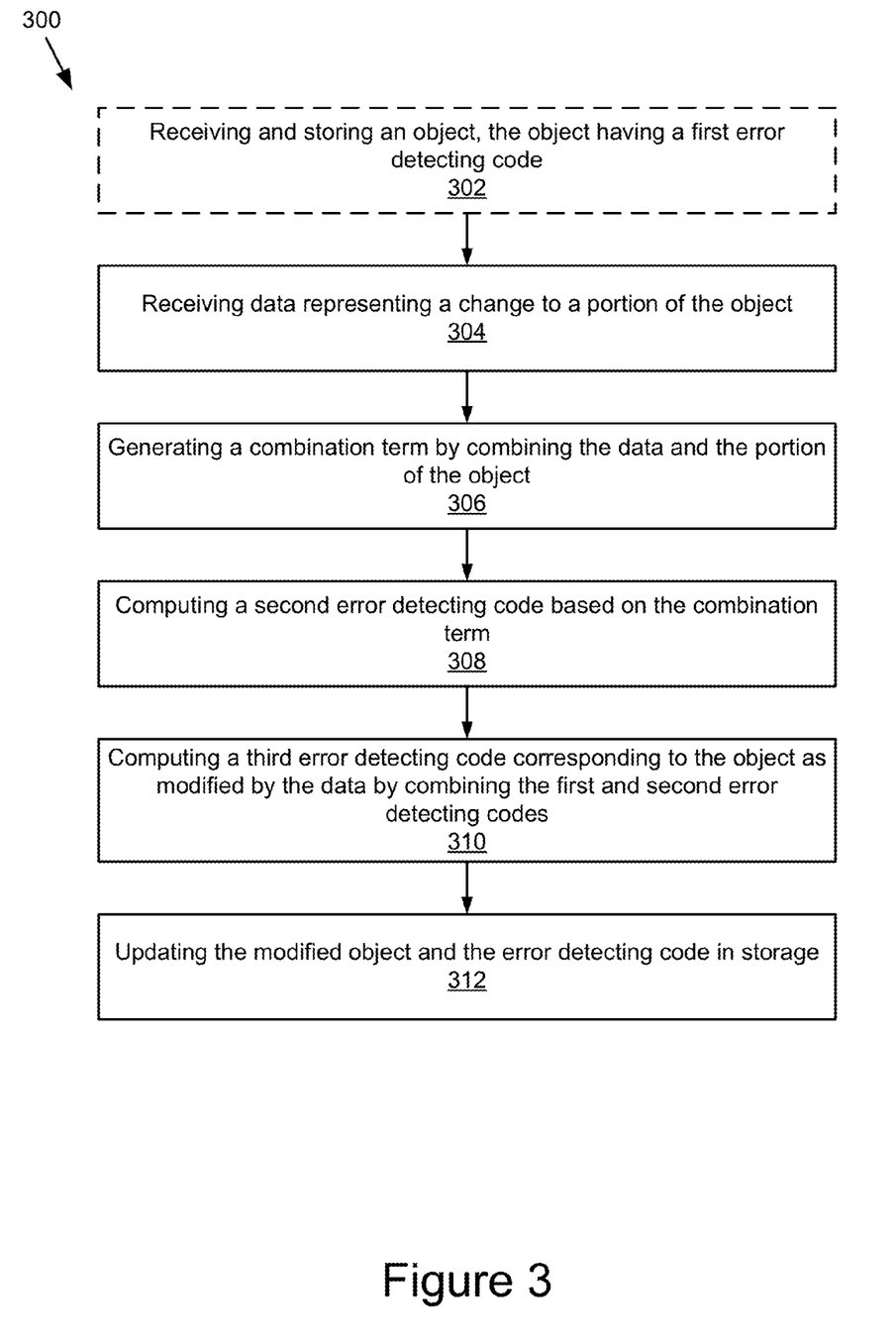
FIG. 3 is a flow chart of an example method for generating an updated error detecting code for a partial update of a data object, according to the techniques described herein.

FIG. 3 is a flow chart of an example method 300 for generating an updated EDC for a partial update of data, according to the techniques described herein. The method 300 enables use of a data object's existing EDC and the portion 406 of the data object that is to be modified to determine a new EDC for the modified data object. The method 300 may be used to compute the new EDC without retrieving the entire data object. For example, only a portion of the data object that is to be updated is read and used to compute the new EDC.

At 302, the storage manager 212 may receive (e.g., from a user or application) and store a data object (e.g., to a storage device) and/or an EDC for the data object. In instances where a received data object does not already have an EDC, the EDC module 214 may calculate an EDC for the data object. In some embodiments, the data object may already be stored with an EDC.

At 304, the storage manager 212 receives data representing a change to the data object (e.g., to a portion 406 of the data object). For example, in some implementations, the storage manager 212 may receive new data and retrieve the data object (or the portion of the data object to be updated) and the data object's EDC for use by the EDC module 214. An illustration of an example data object and modified data object are shown in the example of FIG. 4A.

Figure 4A:
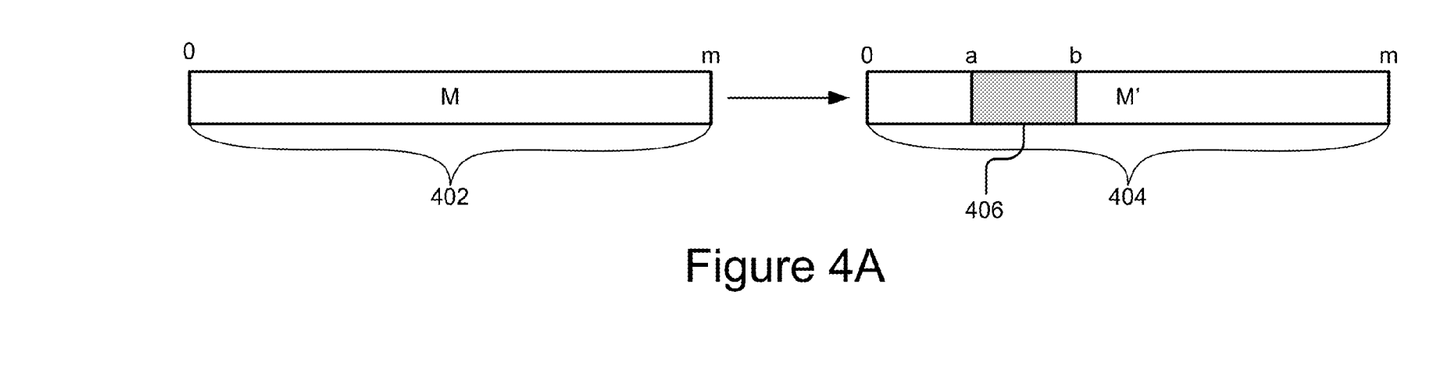
FIG. 4A is a graphical representation of a data object and the data object after being updated, according to the techniques described herein.

FIG. 4A is a graphical representation of a data object and the data object as modified by the new data, according to the techniques described herein. In the example of FIG. 4A, the data object M is represented at 402. The data object M may be, for example, binary data from offset 0 to m. FIG. 4A also includes a representation of the data object M' at 404, which represents the data object M as updated by the new data. For example, a portion of the data object corresponding to a beginning offset "a" and an ending offset "b" represented at 406 (referred to herein as a portion 406) may be modified or replaced by the new data.

Returning to FIG. 3, at 306 the EDC module 214 generates a combination term by combining the new data and the portion 406 of the data object to be modified by the new data. According to some implementations, the EDC module 214 may generate a combination term "Q" including a first part of the combination term and a second part of the combination term. According to other implementations of the techniques described herein, the EDC module 214 may generate a combination term "R."

Figure 4B:
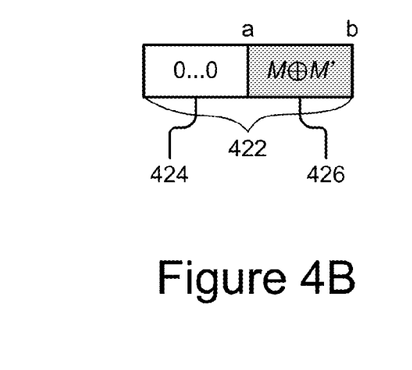
FIGS. 4B and 4C are graphical representations of combination terms used for calculating an updated error detecting code, according to the techniques described herein.

FIG. 4B is a graphical representation of an example combination term Q 422 used for calculating an EDC for a modified data object M', according to the techniques described herein. The first part of the combination term Q 422 may be generated by writing zeros equal to the offset of the portion 406 of the data object. For example, an example first part 424 of the combination term includes zeros up to the offset 'a'. Offset 'a' represents the beginning of the portion 406 of the data object that is to be modified, for example, as shown in FIG. 4A.

The second part 426 of the example combination term Q may be generated by combining the new data and the portion 406 of the data object that is to be updated by the new data. In some implementations, the second part 426 of the combination term may be generated by performing a bitwise exclusive OR (XOR) operation on the new data and the portion of the data object to be updated. For example, the new data may be XORed with the portion 406 of the data object that the new data replaces. Thus, the entire data object does not need to be read from a storage device.

Figure 4C:
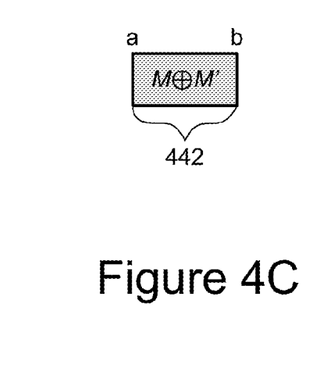

FIG. 4C is a graphical representation of an example combination term R 442 used for calculating a new EDC for a modified data object M', according to the techniques described herein. Unlike the example combination term Q 422 illustrated in FIG. 4B, the example combination term R illustrated in FIG. 4C does not have zeros written up to the offset. The combination term R 442 may be generated by combining the new data and the portion of the data object to be updated by the new data. For example, in some implementations, the new data and the portion 406 of the data object to be modified are combined via a bitwise XOR operation.

Returning to FIG. 3, at 308 the EDC module 214 may compute a second EDC ("combination term EDC") based on the combination term (e.g., the combination term Q at 422, the combination term R at 442, etc.). At 310, the EDC module 214 may compute a third EDC (e.g., an EDC for the updated data object) corresponding to the data object as modified by the data (e.g., M', as illustrated at 404 in FIG. 4A). The EDC for the updated data object is an updated EDC for verifying the integrity (e.g., detecting the presence of an error) of the data object as modified by the data. For example, the EDC for the updated data object may be computed by combining the EDC of the existing data object (e.g., the first EDC) with the combination term EDC.

Figure 5:
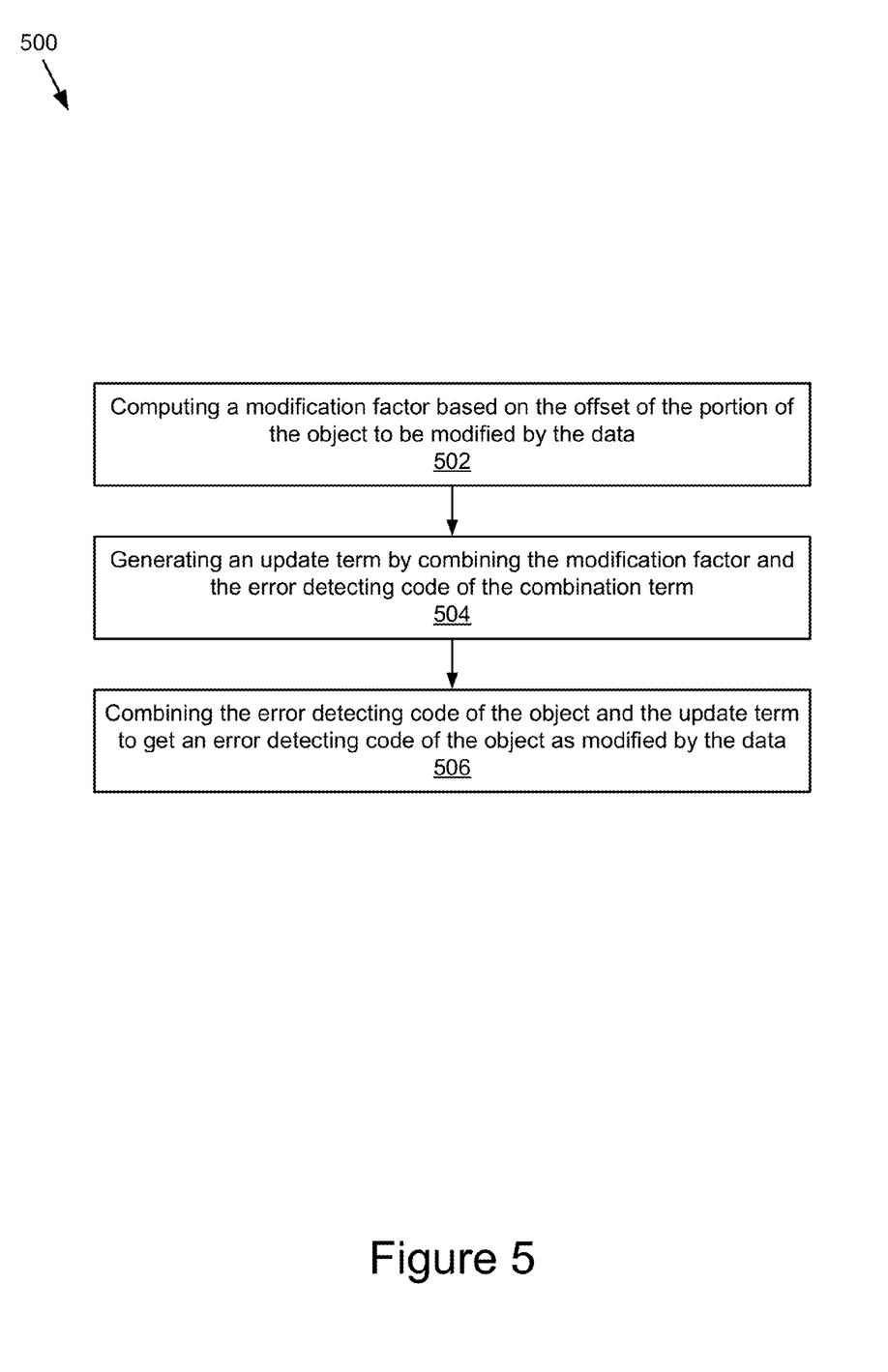
FIG. 5 is a flow chart of an example method for computing an updated error detecting code based on a previous error detecting code and an error detecting code of a combination term, according to the techniques described herein.

In some implementations, such as when the combination term EDC is computed based on the combination term Q, the EDC for the updated data object may be computed by performing a bitwise XOR operation on the first EDC and the combination term EDC. For example, in implementations where the EDC includes a CRC, the following set of relationships can be used to compute the CRC for the updated data object based on a first CRC (e.g., a CRC for the original data object) and a second CRC (e.g., a CRC for the combination term as described above). For example, Equation 2 illustrates a relationship between the first and second CRCs that can be used to determine the third CRC:

$$CRC(M')(X) = CRC(M)(X) \oplus CRC(Q)(X) \qquad (2)$$

where CRC(M')(X) is the CRC of the updated data object as modified by the new data, CRC(M)(X) is the CRC of the unmodified data object, and CRC(Q)(X) is the CRC of the combination term. For the purposes of Equation 2, the combination term is the combination term Q described in reference to FIG. 4B. It should be understood that there are other potential implementations for computing an EDC for the updated data object. For example, another implementation is described in reference to FIG. 5.

If only bit offsets 'a' to 'b' are modified, then Equation 1 may be written as:

$$CRC(M')(X) = \left(\left(\sum_{i=0}^{m} M'_i X^i\right) * X^n\right) \bmod G(X) \qquad (3.1)$$

$$CRC(M')(X) = \left(\left(\sum_{i=0}^{a-1} M'_i X^i + \sum_{i=a}^{b} M'_i X^i \sum_{i=b+1}^{m} M'_i X^i\right) * X^n\right) \bmod G(X) \qquad (3.2)$$

$$CRC(M')(X) = \left(\left(\sum_{i=0}^{a-1} M_i X^i + \sum_{i=a}^{b} M'_i X^i \sum_{i=b+1}^{m} M_i X^i\right) * X^n\right) \bmod G(X) \qquad (3.3)$$

$$CRC(M')(X) = \qquad (3.4)$$
$$\left(\left(\sum_{i=0}^{a-1} M_i X^i + \left(\sum_{i=a}^{b} M_i X^i + \sum_{i=a}^{b} M_i X^i\right)\sum_{i=a}^{b} M'_i X^i \sum_{i=b+1}^{m} M_i X^i\right) *\right.$$
$$\left. X^n\right) \bmod G(X)$$

$$CRC(M')(X) = \qquad (3.5)$$
$$\left(\left(\sum_{i=0}^{a-1} M_i X^i + \left(\sum_{i=a}^{b} M_i X^i + \sum_{i=b+1}^{b} M_i X^i\right) * X^i\right) \bmod G(X) + \right.$$
$$\left(\sum_{i=a}^{b} M_i X^i + \sum_{i=a}^{b} M'_i X^i\right) * X^n\right) \bmod G(X)$$

$$CRC(M')(X) = CRC(M)(X) + \left(\left(\sum_{i=a}^{b} (M + M'_i) X^i\right) * X^n\right) \bmod G(X) \qquad (3.6)$$

$$CRC(M')(X) = CRC(M)(X) + \left(\left(\sum_{i=a}^{b} (M \oplus M')_i X^i\right) * X^n\right) \bmod G(X) \qquad (3.7)$$

Returning to FIG. 3, at 312, the storage manager 212 may store new data in the data object (e.g., update the data object in place) and update the EDC of the data object with the newly computed EDC for the updated data object. For example, the storage manager 212 may update the data object and the EDC in a storage device associated with the device 200.

In some implementations, although not shown in FIG. 3, the device 200 (e.g., the storage manager 212 and/or EDC module 214) may verify the integrity (e.g., determine if there are errors) of the updated data object as modified by the data using the new EDC for the updated data object. For example, the device 200 may verify the integrity of the updated data object when it is retrieved for use by an application 102 or transmitted to another storage device.

FIG. 5 is a flow chart of an example method 500 for computing an updated EDC based on a previous EDC of a data object and an EDC of a combination term, according to the techniques described herein. For example, the method 500 is another implementation for computing a CRC for the updated data object M', similar to the method described at 310 described in FIG. 3.

In some implementations, such as when the combination term EDC is computed based on the combination term R (e.g., as described in reference to FIG. 4C), the EDC computation for the updated data object may include computation of an update term and/or a modification factor. The modification factor may be based on the offset of the portion of the data object to be modified. The update term may include a combination of the modification factor and the EDC of the combination term. The use of the modification factor and/or update term allows the EDC for the updated data object to be computed based on a combination term of a length equal to the portion 406 of the data object. For example, use of the modification factor and/or update term allows the CRC of the updated data object to be calculated without writing zeros up to the offset where the new data is in the data object. In particular, in some instances, the computation of the EDC for the updated data object using the update term and/or the modification factor may be performed very quickly, because parts of the modification factor may be precomputed, as described below.

For example, Equation 4 illustrates a relationship between the original CRC of the data object and the CRC of the combination term that can be used to determine the CRC for the $$CRC(M')(X)=CRC(M)(X)+((X^\alpha \bmod G(X))*CRC(R)(X)) \bmod G(X), \quad (4)$$

updated data object:
where CRC(M')(X) is the CRC of the modified data object, CRC(M)(X) is the CRC of the unmodified data object, $((X^\alpha \bmod G(X))*CRC(R)(X)) \bmod G(X)$ is an example update term, $(X^\alpha \bmod G(X))$ is an example modification factor, and CRC(R)(X) is the CRC of the combination term. For the purposes of Equation 4, the combination term is the combination term R described in reference to FIG. 4C.

Continuing the CRC example from equation 3.7 above:

$$CRC(M')(X) = \quad (5.1)$$

$$CRC(M)(X) + \left(\left(X^a * \sum_{i=0}^{b-a} (M \oplus M')_{i+a} X^i\right) * X^n\right) \bmod G(X)$$

$$CRC(M')(X) = CRC(M)(X) + (X^a * CRC(R)(X)) \bmod G(X) \quad (5.2)$$

At 502, the EDC module 214 may compute a modification factor based on the offset of the portion 406 of the data object. A modification factor is used to compensate for the offset of the modified portion of the data object. In some instances, the modification factor can be computed with standard modular exponentiation techniques, and the final product is a modular multiplication. For example, portions of the example modification factor $X^\alpha \bmod G(X)$ can be precomputed for faster computation of the EDC for the updated data object. To compute the modification factor in the above example of the CRC, the offset 'a' can be described as the sum of the bits of the offset (e.g., as an integer in base 2) in equation 6.1:

$$a = \sum_{i=0}^{\log_2(a)} a_i 2^i \text{ with } a_i \in \{0, 1\} \quad (6.1)$$

Then $X^\alpha \bmod G(X)$ can be described as:

$$X^a \bmod G(X) = \left(\prod_{i=0}^{\log_2(a)} \left(X^{2^i}\right)^{a_i}\right) \bmod G(X) \quad (6.2)$$

$$X^a \bmod G(X) = \left(\prod_{i \in \{0 \ldots \log_2(a)\}, a_i = 1}^{\log_2(a)} X^{2^i} \bmod G(X)\right) \bmod G(X) \quad (6.3)$$

Where $X^{2^i} \bmod G(X)$ of Equation 6.3 may be precomputed, for example. The remaining calculation of the modification factor after computing $X^\alpha \bmod G(X)$ is at most $\log_2 \alpha$ modular multiplications (e.g., if all of the bits written up to the offset 'a' are 1).

At 504, the EDC module 214 may generate an update term by combining the modification factor and the EDC of the combination term (e.g., the combination term R described in FIG. 4C). The update term is an element that may be combined with the EDC of an unmodified data object to generate an EDC of the modified data object. In the above example, the update term may include $((X^\alpha \bmod G(X)*CRC(R)(X)) \bmod G(X)$.

At 506, the EDC module 214 may combine the EDC of the data object and the update term to get an EDC, for example by adding or XORing the update term and the EDC of the data object.

The benefits of the techniques described herein can be seen in an example test system where 256 MiB data objects are stored on a storage device having 200 MB/s throughput, there is a 4 KiB portion of the data object that is to be updated at an offset of 128 MiB, and a CRC can be computed at about 4 GB/s per core on a processor. In tests run on the example system, using the approach of current technology (by reading back the entire data object, modifying the data object, and computing a new CRC on the updated data object), the time required to update the CRC was approximately 1.35 seconds. Alternatively, where the first approach described in reference to Equation 2 is used, the time required to update the CRC was approximately 30 milliseconds. Where the second approach described in reference to Equation 4 is used, the time required to update the CRC was approximately 5 microseconds. Accordingly, it can be seen that the techniques described herein present a significant advantage over past methods.

Systems and methods for generating updated EDC for a partial update of data are described herein. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to user interfaces and particular hardware. Moreover, the technologies disclosed above primarily in the context of on line services; however, the disclosed technologies apply to other data sources and other data types (e.g., collections of other resources for example images, audio, web pages).

Reference in the specification to "one implementation" or "an implementation" means that a particular feature, structure, or characteristic described in connection with the implementation is included in at least one implementation of the disclosed technologies. The appearances of the phrase "in one implementation" in various places in the specification are not necessarily all referring to the same implementation.

Some portions of the detailed descriptions above were presented in terms of processes and symbolic representations of operations on data bits within a computer memory. A process can generally be considered a self-consistent sequence of steps leading to a result. The steps may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory or any type of media suitable for storing electronic instructions, each coupled to a computer system bus.

The disclosed technologies can take the form of an entirely hardware implementation, an entirely software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Finally, the processes and displays presented herein may not be inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A computer-implemented method comprising:
    receiving modification data representing a change to a portion of a data object stored in a storage device, the data object having a length and a first error detecting code, and the portion of the data object starting at a beginning offset that is offset from a beginning of the data object and ending at an ending offset located past the beginning offset;
    generating a combination term by combining the modification data representing the change to the portion of the data object and the portion of the data object;
    computing a second error detecting code based on the combination term;
    computing a third error detecting code by combining the first error detecting code and the second error detecting code, the third error detecting code being configured to detect an error in the data object as changed by the modification data; and
    verifying, using the third error detecting code computed by combining the first error detecting code and the second error detecting code, an integrity of the data object as changed by the modification data.

2. The computer-implemented method of claim 1, wherein generating the combination term by combining the modification data and the portion of the data object includes:
    generating a first part of the combination term by writing a plurality of zeros equal to a length of the beginning offset of the portion of the data object; and generating a second part of the combination term by performing a bitwise exclusive OR operation on the modification data and the portion of the data object.

3. The computer-implemented method of claim 2, wherein computing the third error detecting code includes performing a bitwise exclusive OR operation on the first error detecting code and the second error detecting code.

4. The computer-implemented method of claim 1, wherein generating the combination term by combining the modification data and the portion of the data object includes performing a bitwise exclusive OR operation on the modification data and the portion of the data object.

5. The computer-implemented method of claim 4, wherein computing the third error detecting code includes:
   computing a modification factor based on the offset;
   generating an update term by combining the modification factor and the second error detecting code; and
   combining the update term and the first error detecting code.

6. The computer-implemented method of claim 5, wherein computing the modification factor based on the offset includes precomputing a portion of the modification factor.

7. The computer-implemented method of claim 1, wherein the first error detecting code, the second error detecting code, and the third error detecting code include cyclic redundancy check code.

8. The computer-implemented method of claim 1, further comprising updating the data object based on the modification data without reading the entire data object from the storage device.

9. A system comprising:
   one or more processors; and
   a memory storing instructions that, when executed by the one or more processors, cause the system to:
      receive modification data representing a change to a portion of a data object stored in a storage device, the data object having a length and a first error detecting code, and the portion of the data object starting at a beginning offset that is offset from a beginning of the data object and ending at an ending offset located past the beginning offset;
      generate a combination term by combining the modification data representing the change to the portion of the data object and the portion of the data object;
      compute a second error detecting code based on the combination term;
      compute a third error detecting code by combining the first error detecting code and the second error detecting code, the third error detecting code being configured to detect an error in the data object as changed by the modification data; and
      verify, using the third error detecting code computed by combining the first error detecting code and the second error detecting code, an integrity of the data object as changed by the modification data.

10. The system of claim 9, wherein to generate the combination term by combining the modification data and the portion of the data object includes to:
   generate a first part of the combination term by writing a plurality of zeros equal to a length of the beginning offset of the portion of the data object; and
   generate a second part of the combination term by performing a bitwise exclusive OR operation on the modification data and the portion of the data object.

11. The system of claim 10, wherein to compute the third error detecting code includes to perform a bitwise exclusive OR operation on the first error detecting code and the second error detecting code.

12. The system of claim 9, wherein to generate the combination term by combining the modification data and the portion of the data object includes to perform a bitwise exclusive OR operation on the modification data and the portion of the data object.

13. The system of claim 12, wherein to compute the third error detecting code includes to:
   compute a modification factor based on the beginning offset;
   generate an update term by combining the modification factor and the second error detecting code; and
   combine the update term and the first error detecting code.

14. The system of claim 13, wherein to compute the modification factor based on the beginning offset includes to precompute a portion of the modification factor.

15. The system of claim 9, wherein the first error detecting code, the second error detecting code, and the third error detecting code include cyclic redundancy check code.

16. The system of claim 9, wherein the instructions, when executed by the one or more processors, further cause the system to modify the data object based on the modification data without reading the entire data object from the storage device.

17. A computer-implemented method comprising:
   storing a data object in a storage device, the data object having a first cyclic redundancy check (CRC);
   receiving modification data representing a modification to a portion of the data object, the portion of the data object being offset from a beginning of the data object and an ending of the data object in the storage device;
   performing an exclusive OR operation on the modification data and the portion of the data object to generate a combination term;
   computing a second CRC based on the combination term;
   generating an update term based on the second CRC and the offset;
   combining the first CRC and the update term to generate a third CRC, the third CRC being capable of checking for errors in the data object as modified by the modification data; and
   verifying, using the third CRC generated by combining the first CRC and the update term, an integrity of the data object as modified by the modification data.

18. The computer-implemented method of claim 17, further comprising:
   modifying the portion of the data object in the storage device using the modification data to generate a modified data object; and
   storing the third CRC in the storage device.

19. The computer-implemented method of claim 18, further comprising checking the modified data object for errors using the third CRC.

20. The computer-implemented method of claim 17, wherein the offset includes a number of bits between the beginning of the data object and a beginning of the portion of the data object.

* * * * *